(12) United States Patent
Hirooka et al.

(10) Patent No.: US 6,837,941 B2
(45) Date of Patent: Jan. 4, 2005

(54) CLEANING AND HANDLING METHODS OF ELECTRONIC COMPONENT AND CLEANING APPARATUS THEREOF

(75) Inventors: Taisuke Hirooka, Hyogo (JP); Hidetaka Sakumichi, Hyogo (JP)

(73) Assignee: Neomax Co., Ltd., Osaka (JP)

( * ) Notice: Subject to any disclaimer, the term of this patent is extended or adjusted under 35 U.S.C. 154(b) by 109 days.

(21) Appl. No.: 09/337,278

(22) Filed: Jun. 22, 1999

(65) Prior Publication Data

US 2002/0062843 A1 May 30, 2002

(30) Foreign Application Priority Data

Jun. 24, 1998 (JP) .......................................... 10-193758
Nov. 17, 1998 (JP) .......................................... 10-343551

(51) Int. Cl.⁷ .............................................. C23G 1/00
(52) U.S. Cl. .............................. 134/2; 134/6; 134/34; 134/36; 134/42; 510/175; 205/205; 15/77; 15/102
(58) Field of Search ........................... 134/2, 6, 34, 36, 134/42, 902; 510/175; 205/205; 15/77, 102

(56) References Cited

U.S. PATENT DOCUMENTS

| | | | | |
|---|---|---|---|---|
| 3,898,351 A | * | 8/1975 | Kennison et al. ............. 427/57 |
| 5,336,371 A | * | 8/1994 | Chung et al. ............. 156/659.1 |
| 5,516,730 A | * | 5/1996 | Pirooz et al. ................. 437/235 |
| 5,693,148 A | * | 12/1997 | Simmons et al. ............. 134/18 |
| 5,712,198 A | * | 1/1998 | Shive et al. ................. 437/235 |
| 5,723,019 A | * | 3/1998 | Krusell et al. ................. 134/6 |
| 5,741,403 A | * | 4/1998 | Tenhover et al. ........ 204/192.2 |
| 5,845,660 A | * | 12/1998 | Shindo et al. ................. 134/56 |
| 5,873,380 A | * | 2/1999 | Kanno ...................... 134/102.1 |
| 6,001,191 A | * | 12/1999 | Kamikawa et al. ........... 134/32 |
| 6,146,469 A | * | 11/2000 | Toshima ...................... 134/37 |
| 6,167,583 B1 | * | 1/2001 | Miyashita et al. ............. 15/77 |

FOREIGN PATENT DOCUMENTS

| | | | | | |
|---|---|---|---|---|---|
| JP | 403131026 A | * | 6/1991 | ......... H01L/21/304 |
| JP | 404206724 A | * | 7/1992 | ......... H01L/21/304 |
| JP | 410064872 A | * | 3/1998 | ......... H01L/21/304 |

OTHER PUBLICATIONS

Kern, W., Handbook of Semiconductor Wafer Cleaning Technology, "Science, Technology, and Applications", pp. 76–81 (1993).*

* cited by examiner

Primary Examiner—Michael Barr
Assistant Examiner—Gentle E. Winter
(74) Attorney, Agent, or Firm—Armstrong, Kratz, Quintos, Hanson & Brooks, LLP (57) ABSTRACT

A cleaning apparatus of an electronic component of the present invention comprises: means for supplying cleaning water to an object to be cleaned such as alumina titanium carbide wafer, a sponge member for contacting with the object to be cleaned to clean a surface thereof, means for moving the object to be cleaned and the sponge member relative to each other, and means for adjusting the resistivity value of the cleaning water to 10MΩ or less. Using this apparatus, the object to be cleaned is cleaned using the sponge member while supplying, to the object to be cleaned, cleaning water having the resistivity value of 10MΩ or less. In this case, the cleaning degree is enhanced by soaking the object to be cleaned in the water having the resistivity value of 10MΩ or less before cleaning, and by using a dummy substrate.

6 Claims, 8 Drawing Sheets

CLEANING AND HANDLING METHODS OF ELECTRONIC COMPONENT AND CLEANING APPARATUS THEREOF

TECHNICAL FIELD

The present invention relates to cleaning and handling methods of an electronic component and a cleaning apparatus thereof, and more particularly, to cleaning and handling methods of an electronic component suitable for cleaning of a ceramic wafer such as a wafer made of, e.g., alumina titanium carbide, and to a cleaning apparatus therefor.

BACKGROUND TECHNIQUE

Conventionally, as a cleaning method of an electronic component of this type, there is a known cleaning method for cleaning an object to be cleaned (which will be referred to as an object to be cleaned, hereinafter) using a sponge member while supplying cleaning water to the object to be cleaned.

In the case of such a conventional cleaning method, a considerably high cleaning degree is obtained by both cleaning with the cleaning water and wiping operation of the object to be cleaned with the sponge member.

However, when the object to be cleaned is wiped with the sponge member, the object to be cleaned is adversely charged with electricity, and there are problems that even if the cleaning operation is repeated, the certain amount of dust is remained, and the object to be cleaned is soiled with the dust adhered to the sponge member.

Thereupon, it is an object to provide cleaning and handling methods of an electronic component and a cleaning apparatus therefor capable of achieving the cleaning degree higher than that of the conventional cleaning method of the electronic component.

DISCLOSURE OF THE INVENTION

The present inventors wholeheartedly studied to solve the above problems and as a result, they found that it is possible to clean an electronic component extremely excellently by using cleaning water having the resistivity value of $10M\Omega$ or less, by separating the sponge member from the object to be cleaned during cleaning to clean the sponge member with the cleaning water having the resistivity value of $10M\Omega$ or less, and by soaking the object to be cleaned in the cleaning water having the resistivity value of $10M\Omega$ or less before cleaning.

The present invention has been achieved based on these facts, and according to a first aspect of the present invention, there is provided a cleaning method of an electronic component wherein an object to be cleaned is cleaned using a sponge member while supplying, to the object to be cleaned, cleaning water having the resistivity value of $10M\Omega$ or less.

According to a second aspect, in the first aspect, the resistivity value of the cleaning water is adjusted to $5M\Omega$ or less by including carbon dioxide gas in the cleaning water.

According to a third aspect, in the first aspect, the sponge member is separated from the object to be cleaned during cleaning, and the cleaning water is supplied also to the separated sponge member.

According to a fourth aspect, in the second aspect, the sponge member is separated from the object to be cleaned during cleaning, and the cleaning water is supplied also to the separated sponge member.

According to a fifth aspect, in the first aspect, the object to be cleaned is a ceramic wafer.

According to a sixth aspect, in the second aspect, the object to be cleaned is a ceramic wafer.

According to a seventh aspect, in the third aspect, the object to be cleaned is a ceramic wafer.

According to an eighth aspect, in the fourth aspect, the object to be cleaned is a ceramic wafer.

According to a ninth aspect, there is provided a cleaning method of an electronic component wherein an object to be cleaned is soaked in cleaning water having the resistivity value of $10M\Omega$ or less before cleaning.

According to a tenth aspect, in any one of the first to ninth aspects, the object to be cleaned is soaked in the cleaning water having the resistivity value of $10M\Omega$ or less before cleaning.

According to an eleventh aspect, there is provided a handling method of an electronic component wherein a substrate which is an object to be cleaned is placed on a substrate holding piece of a substrate rack, and when the substrate is cleaned and then the substrate is placed on another substrate holding piece of another substrate rack, a dummy substrate is located on a film formed surface of the substrate.

According to a twelfth aspect, there is provided a handling method of an electronic component wherein when a substrate which is an object to be cleaned is cleaned and then is preserved in a state in which the substrate is placed on a substrate holding piece of a substrate rack, the substrate rack is inclined so that a film formed surface side does not contact with the substrate holding piece of the substrate rack.

According to a thirteenth aspect, in the eleventh aspect, when a substrate which is an object to be cleaned is cleaned and then is preserved in a state in which the substrate is placed on a substrate holding piece of a substrate rack, the substrate rack is inclined so that a film formed surface side does not contact with the substrate holding piece of the substrate rack.

According to a fourteenth aspect, there is provided a cleaning apparatus of an electronic component comprising: means for supplying cleaning water to an object to be cleaned, a sponge member for contacting with the object to be cleaned to clean a surface thereof, means for moving the object to be cleaned and the sponge member relative to each other, and means for adjusting the resistivity value of the cleaning water to $10M\Omega$ or less.

According to a fifteenth aspect, in the fourteenth aspect, the apparatus further comprises a soaking portion for soaking the object to be cleaned before being cleaned into the cleaning water having the resistivity value of $10M\Omega$ or less.

According to a sixteenth aspect, in the fourteenth aspect, the apparatus further comprises means for supplying carbon dioxide gas for adjusting the resistivity value of the cleaning water to $5M\Omega$ or less.

According to a seventeenth aspect, in the fifteenth aspect, the apparatus further comprises means for supplying carbon dioxide gas for adjusting the resistivity value of the cleaning water to $5M\Omega$ or less.

According to an eighteenth aspect, in the fourteenth aspect, the apparatus further comprises means for supplying the cleaning water also to the sponge member which is separated from the object to be cleaned during cleaning.

According to a nineteenth aspect, in the fifteenth aspect, the apparatus further comprises means for supplying the cleaning water also to the sponge member which is separated from the object to be cleaned during cleaning.

According to the present invention, in the cleaning method of an electronic component for cleaning an object to be cleaned using a sponge member while supplying the cleaning water to the object to be cleaned, it is possible to achieve the rapid and excellent cleaning by the extremely simple means, i.e., by adjusting the resistivity of the cleaning water, and this effect could not be obtained by the conventional cleaning method of electronic component in which the object to be cleaned is cleaned with cleaning water and wiped.

BEST MODE FOR CARRYING OUT THE INVENTION

Embodiments of the present invention will be explained based on the drawings below.

Figure 1:
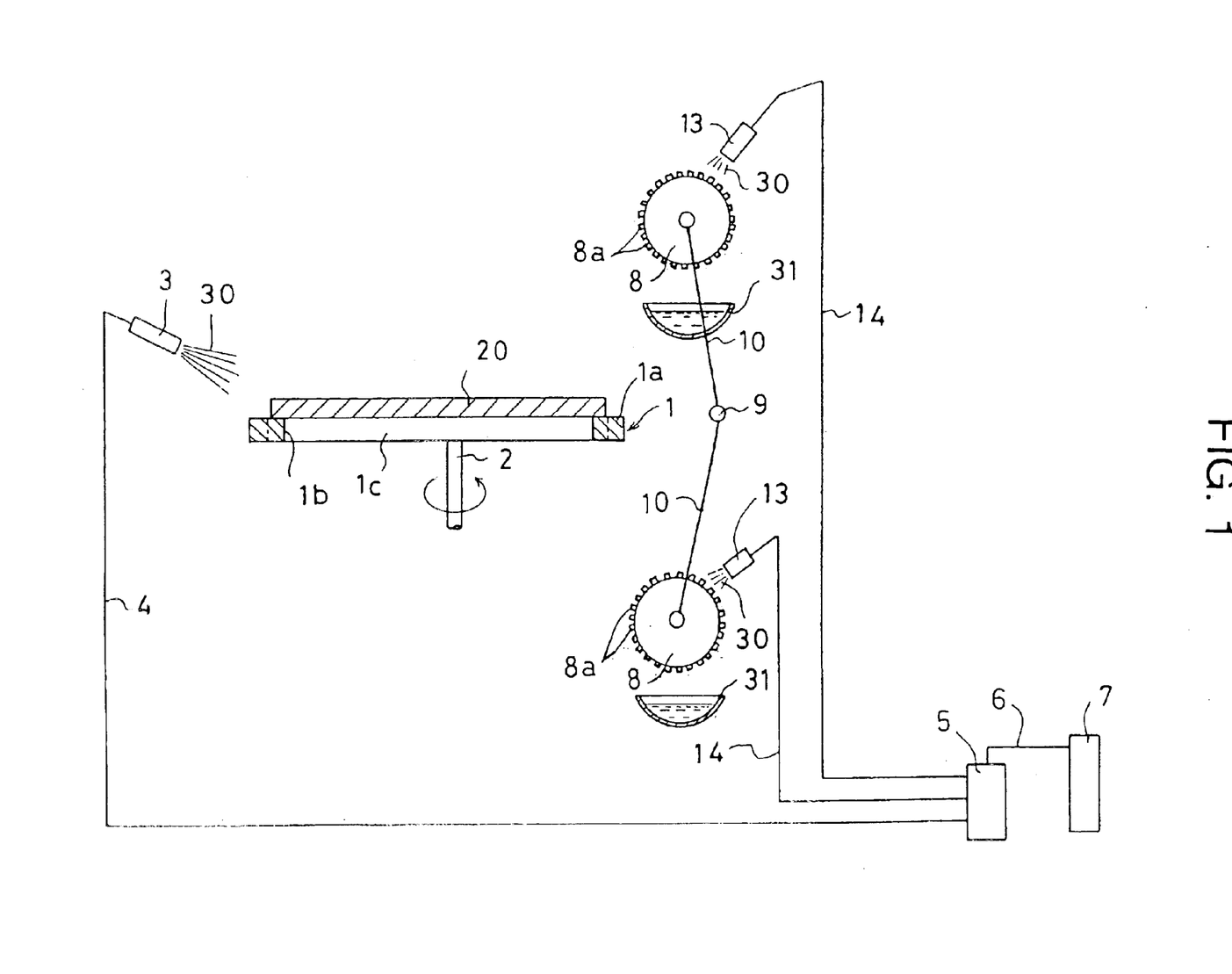
FIG. 1 is an explanatory diagram of an embodiment of a cleaning apparatus of an electronic component.
Figure 2:
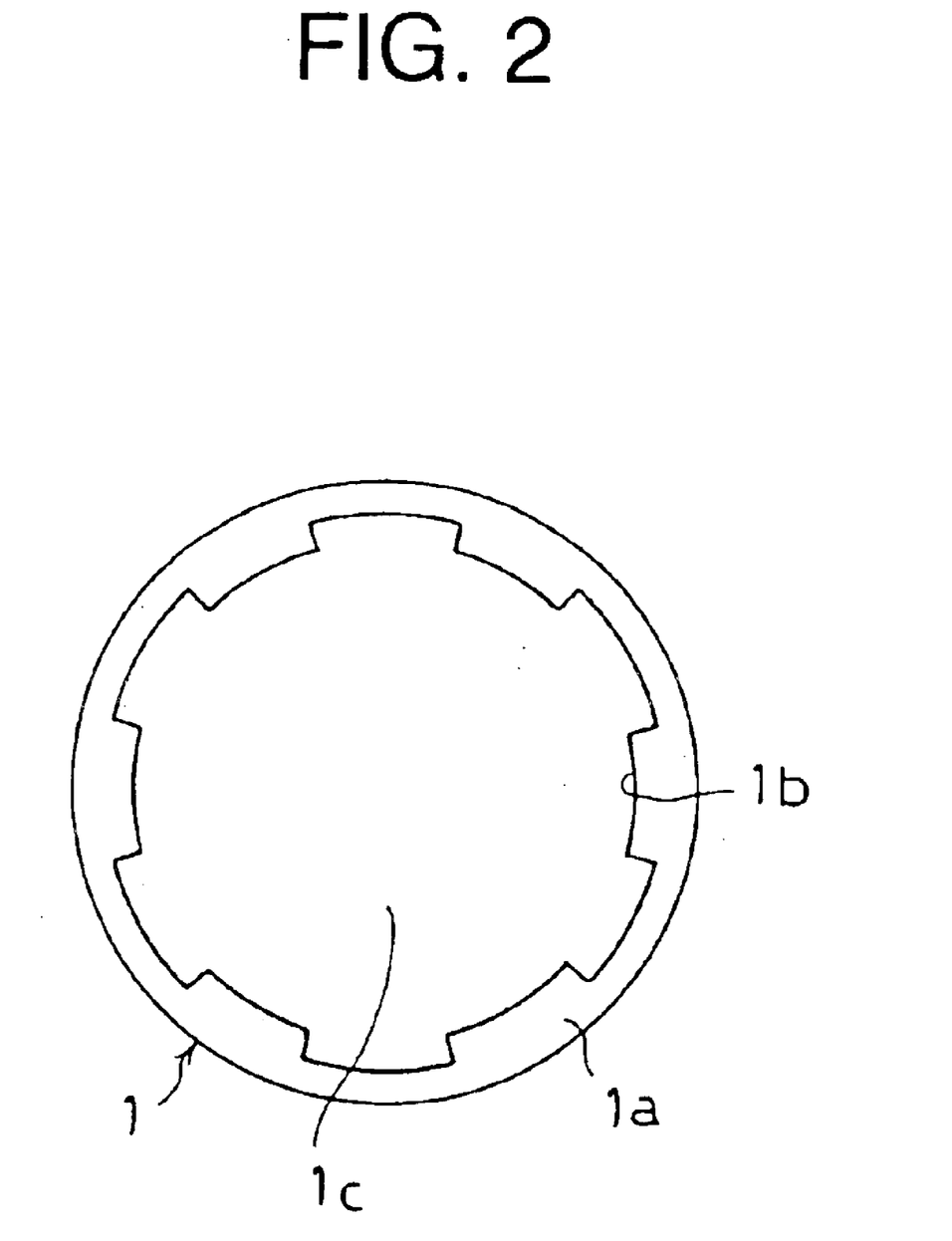
FIG. 2 is a plan view of a stage of the cleaning apparatus.

FIGS. 1 and 2 show an embodiment of a cleaning apparatus of an electronic component of the present invention. In the drawings, the reference number 1 represents a ring-like stage fixed on an upper end of a driving shaft 2 which is rotated through a driving mechanism (not shown). As shown in FIG. 2, the ring-like stage includes a ring-like member 1a, and supporting projections 1b disposed along an inner periphery of the ring-like member at a distance from one another. A object to be cleaned 20 such as a wafer made of alumina titanium carbide is placed on the supporting projections 1b so that both front and back surfaces of the object to be cleaned 20 can simultaneously be cleaned utilizing central space 1c of the stage 1.

In FIG. 1, the reference number 3 represents a cleaning water supply nozzle for supplying cleaning water 30 to the object to be cleaned 20. The nozzle 3 is connected to a superpure water tank 5 through a supply pipe 4. A desired amount of carbon dioxide gas is supplied to the superpure water tank 5 from a carbon dioxide gas cylinder 7 connected to the latter through a connection pipe 6, and the cleaning water 30 is supplied to the object to be cleaned 20 from the cleaning water supply nozzle 3. The resistivity of cleaning water 30 can be adjusted to 10MΩ or less.

In FIG. 1, the reference numbers 8 represent a pair of sponge members each comprising polyvinyl alchohol sponge (Bellclean by trademark of Kanebou Corp.). Each of the sponge member 8 are capable of rotating through a driving mechanism (not shown), and is brought into contact with a surface of the object to be cleaned so that dust existing on the object to be cleaned 20 is wiped away with the projections 8a formed on the surface of the sponge member 8.

The pair of sponge members 8 are connected to a fulcrum 9 through arm members 10. The sponge members 8 are arranged such that the members 8 sandwich and simultaneously clean both the front and back surfaces of the object to be cleaned 20 by the swinging movement of the arm members 10, and such that the sponge members 8 simultaneously separate from the object to be cleaned.

In a position of each of the sponge members 8 separated from the object to be cleaned 20, a cleaning water supply nozzle 13 is closely disposed. The cleaning water supply nozzle 13 is connected to the superpure water tank 5 through a supply pipe 14. In the separated position of the sponge member 8, cleaning water 30 whose resistivity is adjusted to be 10MΩ or less is supplied. In FIG. 1, the reference number 31 represents a saucer of the cleaning water. Although the saucer 31 merely receives the cleaning water 30 supplied from the cleaning water supply nozzle 13 in the present embodiment, the saucer 31 may be filled with cleaning water 30 and the sponge member 8 may be soaked therein.

A cleaning method using the cleaning apparatus for the electronic component will be explained next.

First, the object to be cleaned 20 is place on a predetermined position of the stage, the stage 1 is rotated and the cleaning water 30 is supplied to the object to be cleaned 20. It is preferable that the cleaning water 30 is supplied such that the cleaning water 30 sufficiently widespread on both the front and back surfaces of the object to be cleaned 20, and that the supply of the cleaning water 30 is continued until the cleaning operation of the object to be cleaned 20 is completed.

Next, the sponge members 8 which are rotating are brought close to positions to contact with the front and back surfaces of the object to be cleaned 20 to which the cleaning water 30 is supplied, so as to wipe off the dust on the object to be cleaned 20 such that the projections 8a provided on the surfaces of the sponge members 8 wipe both the front and back surfaces of the object to be cleaned 20.

At that time, since the resistivity of the cleaning water 20 is adjusted to be 10MΩ or less, the object to be cleaned 20 is not charged with electricity by the contact with the sponge members 8 and therefore, dust should not be remained on the object to be cleaned 20.

When appropriate time during the cleaning, the sponge members 8 are separated from the object to be cleaned 20, and in the separated positions, the cleaning water 30 whose resistivity is adjusted to be 10MΩ or less is supplied to the sponge members 8 from the cleaning water supply nozzles 13, thereby removing the dust adhered to the sponge members 8.

Since the sponge members are appropriately cleaned with the cleaning water 30 whose resistivity is adjusted to be 10MΩ or less in this manner, it is possible to keep clean the sponge members 8 which contact with the object to be cleaned 20 to wipe the dust existing on the surfaces thereof during the cleaning operation.

Since the object to be cleaned is cleaned using the cleaning water 30 whose resistivity is adjusted to be 10MΩ or less in this manner, the object to be cleaned should not be charged with electricity even though the sponge members 8 are used, it is unnecessary to repeat the cleaning operation many times, and it is possible to clean the object to be cleaned to a high cleaning degree.

Although the carbon dioxide gas is supplied to the superpure water from the carbon dioxide gas cylinder 7 as the means for adjusting the resistivity of the cleaning water comprising the superpure water in the present embodiment, the adjusting means of the resistivity of the cleaning water is not limited to this. For example, if the object to be cleaned is not easily influenced by alkali such as zirconia, alkali ion using ammonia may be added. Further, if the object to be cleaned is not easily influenced by acid such as alumina, it is possible to add sulfur oxide or nitrogen oxide.

However, when the object to be cleaned is weak in alkali such as alumina titanium carbide wafer, and when an outbreak and processing of powder generated by adding the sulfur oxide or nitrogen oxide are not appropriate, it is most preferable to add carbon dioxide as in the present embodiment.

Figure 5:
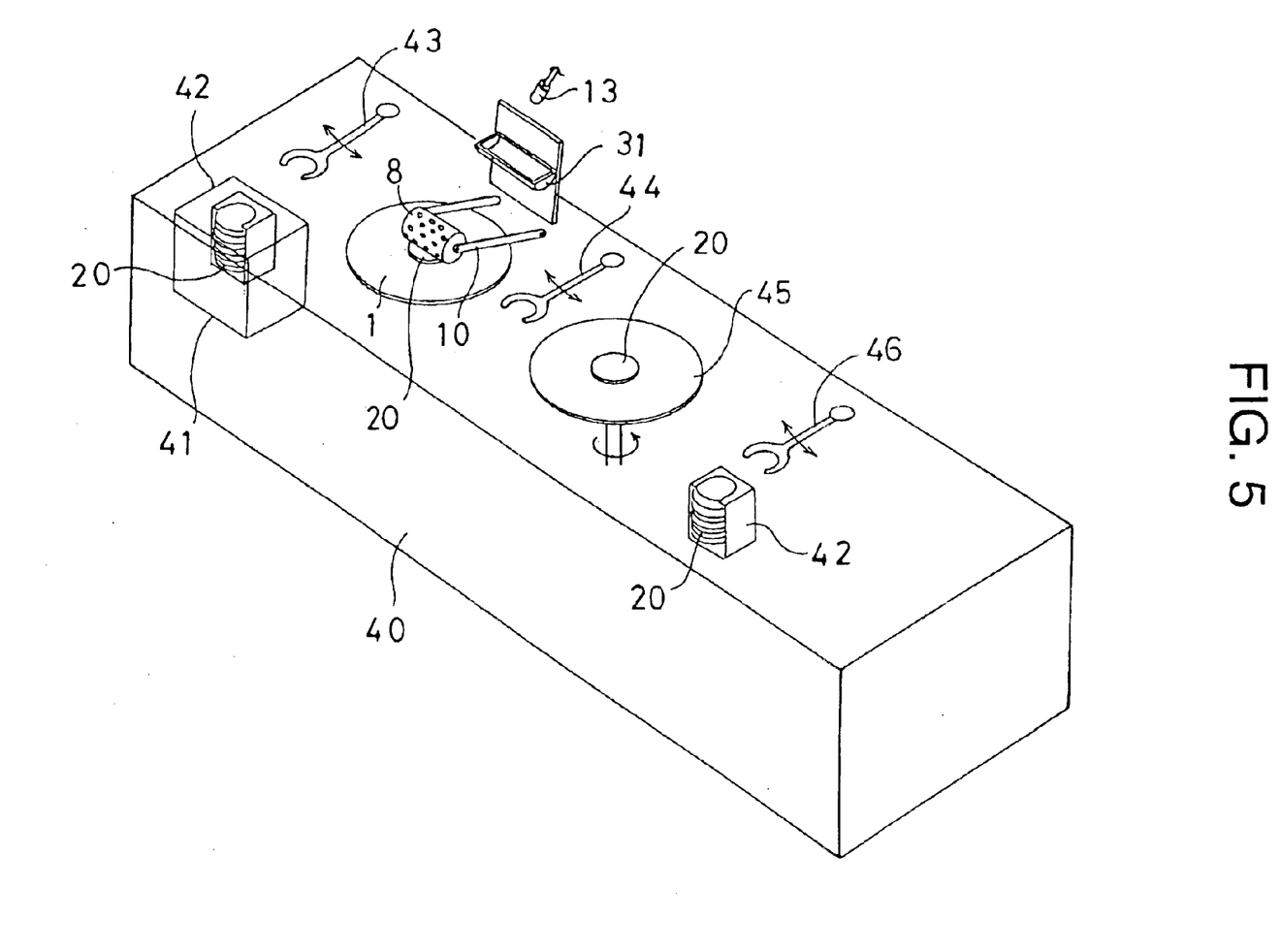
FIG. 5 is a perspective view of a cleaning apparatus of an electronic component according to another embodiment of the present invention.

FIG. 5 shows another embodiment of a cleaning apparatus of an electronic component of the present invention.

Elements similar to those in the previous embodiment are represented with the same reference numbers, and their detailed explanations will be omitted.

In the present embodiment, a soak tank 41 into which cleaning water whose resistivity is adjusted to be 10MΩ or less is supplied is provided in a left end of an apparatus body 40 so that the object to be cleaned 20 which is a substrate can be soaked in the cleaning water before the cleaning operation. At that time, the resistivity of the cleaning water supplied into the soak tank 41 is adjusted to 5MΩ or less by supplying carbon dioxide gas from a carbon dioxide gas cylinder (not shown).

The reference number 42 represents substrate racks each having a plurality of, ten in the illustrated embodiment, substrate holding pieces 42a. A plurality of substrates 20 can be placed on the substrate holding pieces 42a and accommodated. The substrates 20 before being cleaned (which will be referred to as pre-cleaning substrate) are accommodated on the left side substrate rack 42 in FIG. 5, and the substrates 20 after being cleaned (which will be referred to as post-cleaning substrate) are accommodated on the right side substrate rack 42 in FIG. 5.

The reference number 43 represents a substrate take-out arm for taking out the pre-cleaning substrate 20 from the substrate rack 42 soaked in the soak tank 41 and transferring the same onto the stage 1. The reference number 44 represents a substrate transfer arm for transferring the post-cleaning substrate 20 to a next spin dryer 45. The reference number 46 represents a substrate accommodation arm for taking out the dried substrate 20 from the spin dryer 45 and accommodating the same on the substrate rack 42.

A cleaning method using the cleaning apparatus for the electronic component will be explained next.

First, a dummy substrate 20d is accommodated in the lowermost position of the substrate rack 42, the pre-cleaning substrate 20 are accommodated above the dummy substrate 20d such that a film formed surface of each of the substrates 20 is directed upward, and the substrate rack 42 is soaked in the soak tank 41 to prepare for the next cleaning step.

Next, the dummy substrate 20d and then the other substrates 20 are sequentially taken out from the lowermost side of the substrate rack 42 by the substrate take-out arm 43 and are transferred onto the stage 1. Although the detailed explanation is not repeated, each of the substrates 20 is cleaned by the sponge members 8 which supplying the cleaning water having the resistivity of 10MΩ or less as in the previous embodiment.

By soaking the substrate 20 in the soak tank 41 filled with the cleaning water having the resistivity of 10MΩ or less before the cleaning operation using the sponge member 8 in this manner, dust is more reliably prevented from adhering to the substrate 20 which is the object to be cleaned by static electricity, and a higher cleaning degree is achieved.

Next, the cleaned substrate 20 is transferred from the stage 1 to the spin dryer 45 by the substrate transfer arm 44 to dry the substrate 20 by the spin dryer 45.

Thereafter, the substrates 20 are sequentially transferred from the spin dryer 45 to the substrate rack 42 and accommodated therein from its uppermost position.

Figure 6:
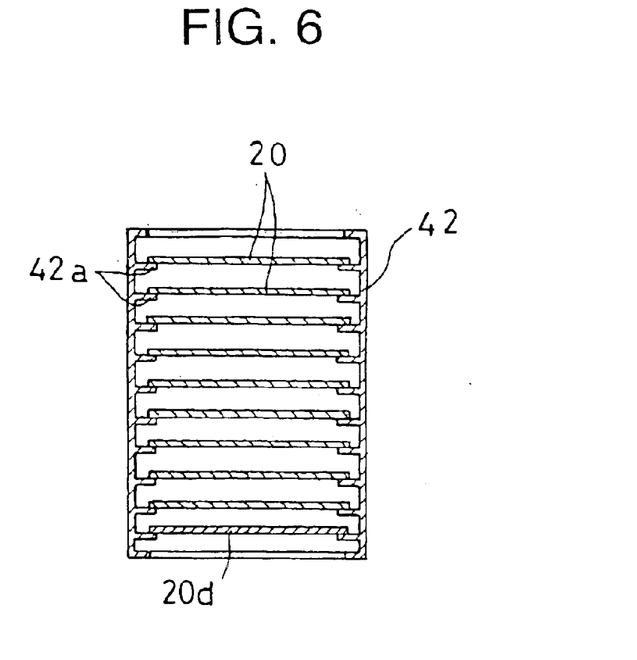
FIG. 6 is a front view of a substrate rack accommodating a substrate before it is cleaned.
Figure 7:
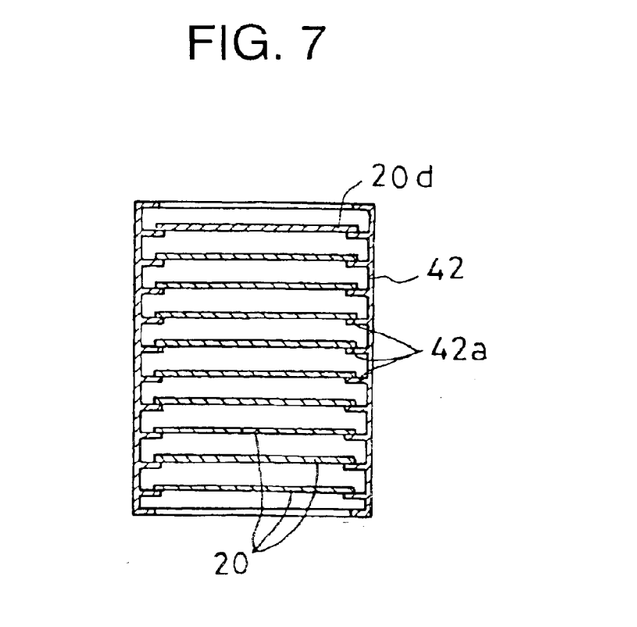
FIG. 7 is a front view of a substrate rack accommodating a substrate after it is cleaned.

By repeating such cleaning step, drying step and accommodating step, the dummy substrate 20d which was located at the lowermost position in the substrate rack 42 accommodating the pre-cleaning substrates as shown in FIG. 6 is now accommodated at the uppermost position in the substrate rack 42 accommodating the dried substrates 20 as shown in FIG. 7. This dummy substrate 20d prevents the film formed surfaces of the cleaned substrates 20 sequentially accommodated below the dummy substrate 20 from being soiled.

Figure 8:
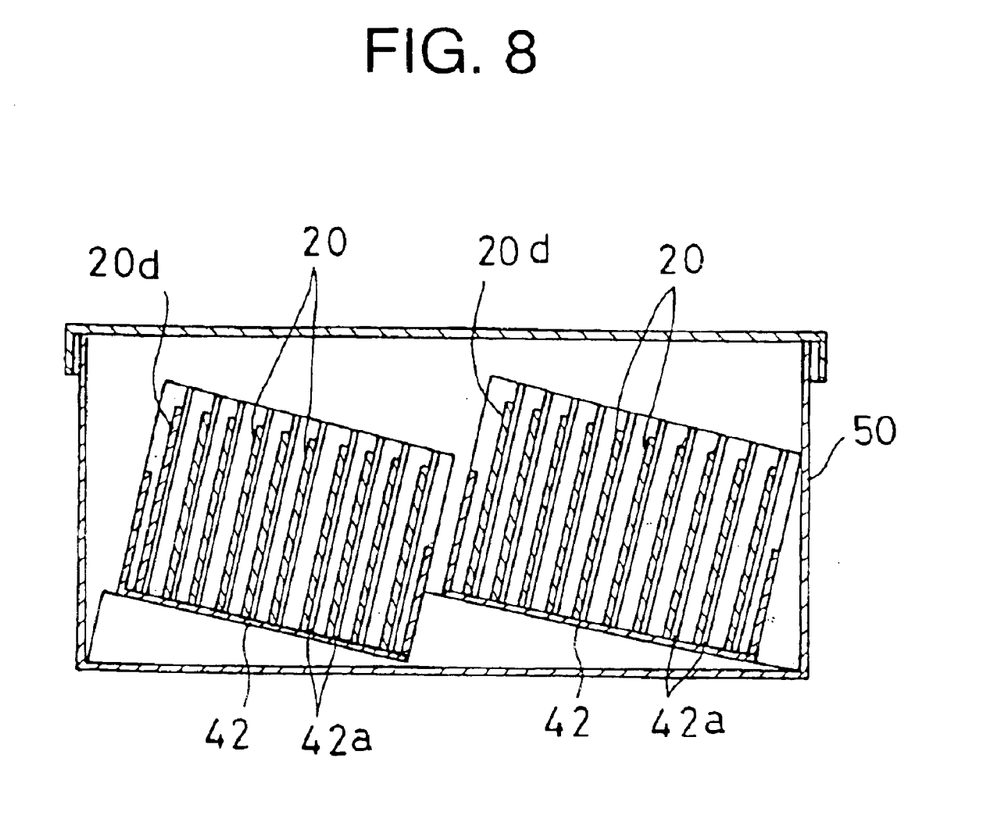
FIG. 8 is an explanatory diagram showing a keeping state of the substrate rack.

Further, according to the present embodiment, the substrate rack 42 for accommodating the cleaned and dried substrates 20 is inclined and accommodated in a keeping box 50 as shown in FIG. 8. Therefore, the substrates 20 are kept such that their film formed surfaces do not contact with the substrate holding pieces 42a.

Figure 9:
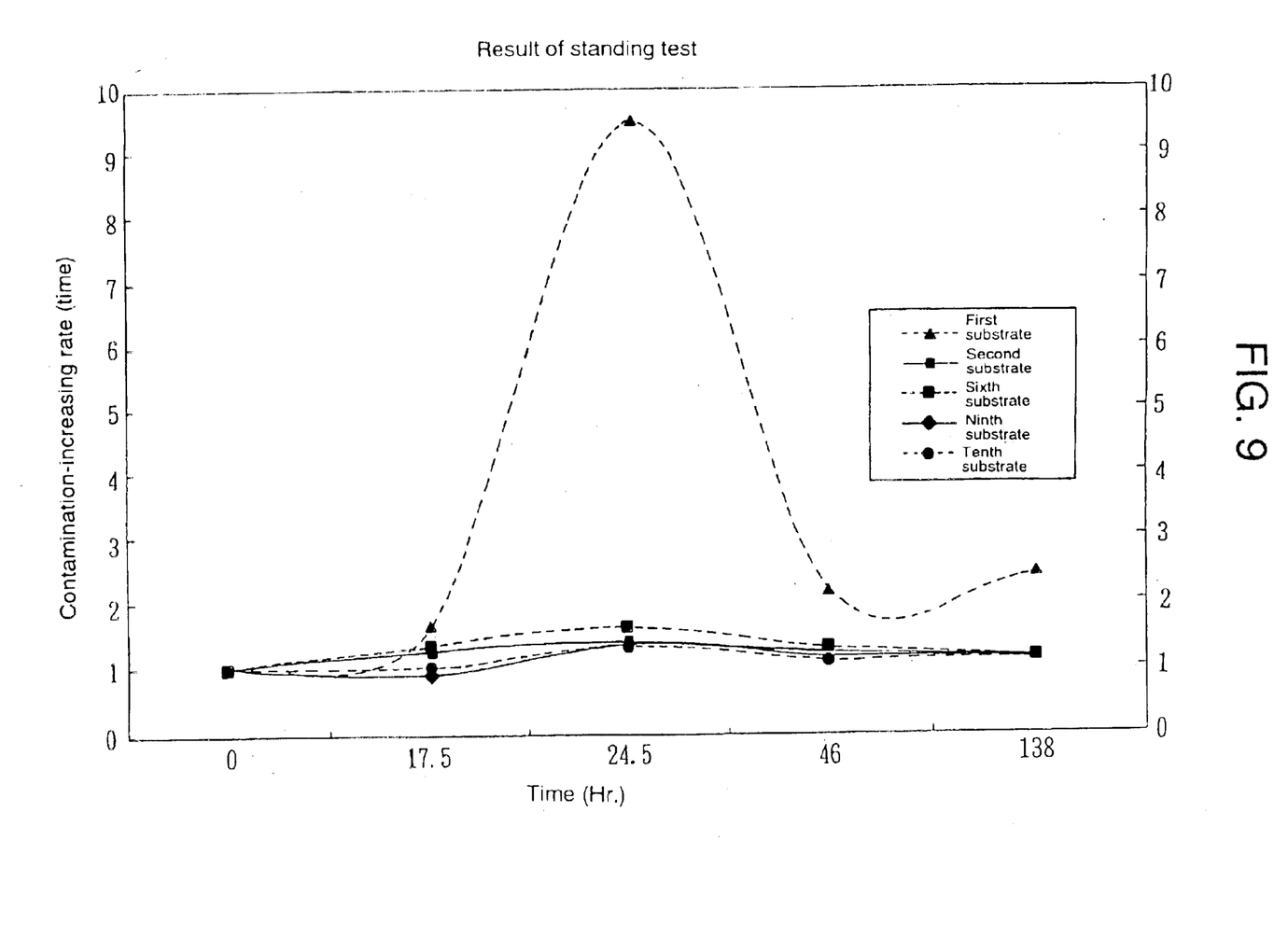
FIG. 9 is a graph of characteristics for explaining the soil preventing effect using a dummy substrate.

Ten substrates (including dummy substrate) accommodated in the keeping box 50 and then the keeping box 50 is placed outside a clean room within a plant, and a degree of soil was measured. FIG. 9 shows results of the measurement. As can be seen from FIG. 9, it was confirmed that only the dummy substrate was soiled, and the soil preventing effect using the dummy substrate was great.

The degree of soil was measured and evaluated using alumina titanium carbide wafer having a diameter of four inches and a thickness of 2 mm, and Surfscan made by Tencor Corp. (laser type particle counter having resolving power of 0.5 μm or more).

A concrete example using the cleaning apparatus of the electronic component described in the above embodiments will be explained next.

In the present example, alumina titanium carbide wafer having a diameter of four inches was used as the object to be cleaned.

As the cleaning water, carbon dioxide gas was supplied to superpure water and substantially saturated, and the resistivity was adjusted to 0.3MΩ.

In the cleaning process, the alumina titanium carbide wafer having a diameter of four inches was used and the number of particles on the wafer was previously measured, time of one brushing cleaning step was set to 30 seconds, and spin dry was carried out per one brushing cleaning process. The number of particles on the wafer was measured at each cleaning step. Such cleaning step and measurement were repeated.

The number of particles on the wafer was measured using Surfscan made by Tencor Corp. (laser type particle counter having resolving power of 0.5 μm or more).

As a comparative example, superpure water (resistivity of 17MΩ) was used as the cleaning water and the alumina titanium carbide wafer having a diameter of four inches was cleaned in the same manner as that of the example, and the measurement was repeated.

Figure 3:
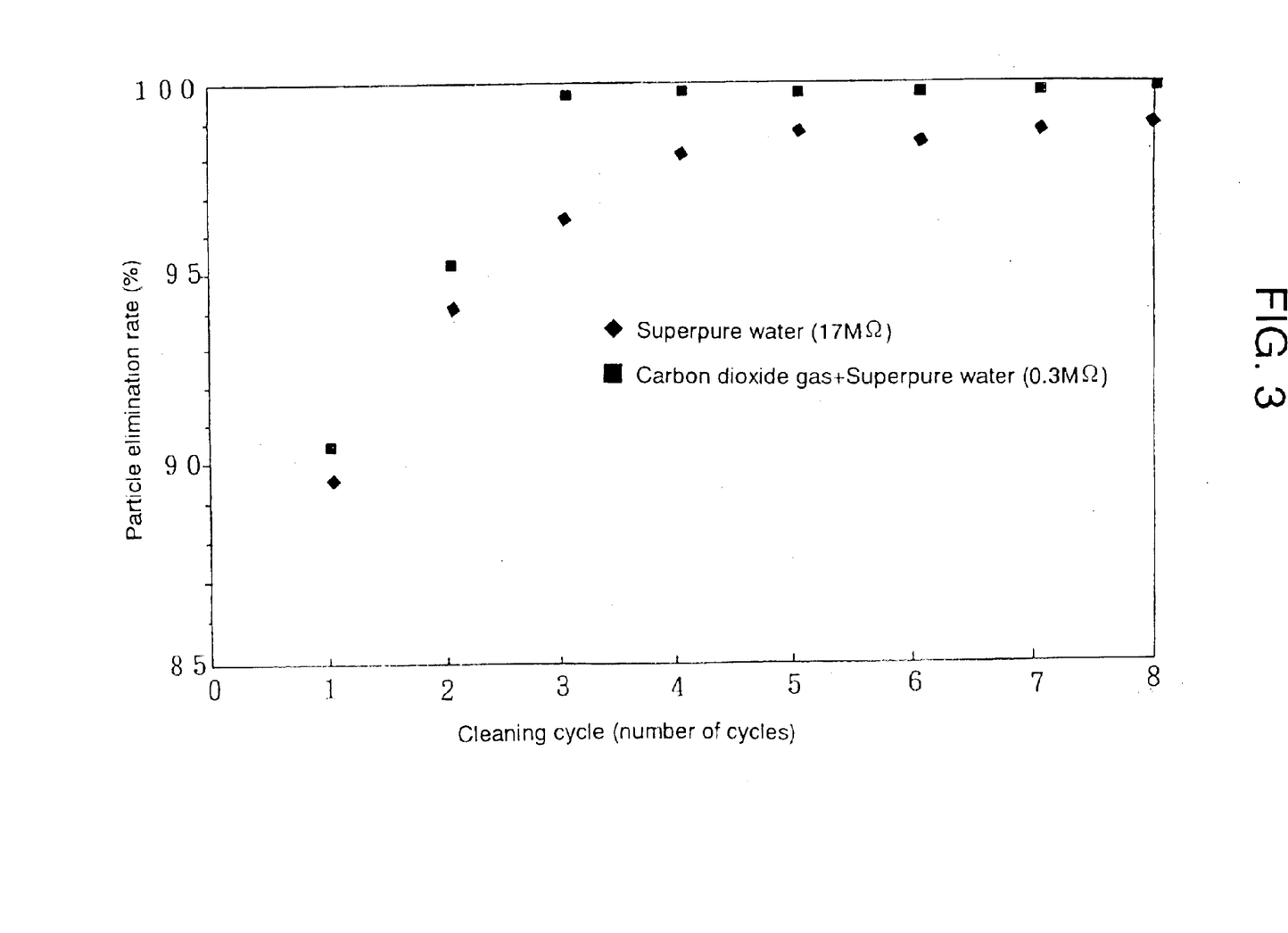
FIG. 3 is a graph of characteristics showing the cleaning effect by a cleaning method of the electronic component of the present invention.

Next, the number of particles remained on a surface of each of the alumina titanium carbide wafers of the present example and the comparative example was measured, and its result is shown in FIG. 3 as elimination rate.

As shown in FIG. 3, in the case of the present example, a high cleaning degree as high as substantially 100% elimination rate could be achieved by three cleaning cycles. Whereas, in the case of the comparative example, 100% elimination rate could not be achieved even though the cleaning cycle was repeated more than five times, and even if the cleaning cycle was further repeated, the elimination rate was not enhanced, and the higher cleaning was not possible.

Next, the value of the resistivity of the cleaning water and a cleaning degree of the object to be cleaned were measured.

An alumina titanium carbide wafer having a diameter of four inches as in the previous example was used as the object to be cleaned. As the cleaning water, carbon dioxide gas was supplied to superpure water while adjusting its flow rate, and the resistivity was adjusted to 0.1 to 17M$\Omega$. Other conditions were the same as those of the previous example, and the cleaning step was carried out once and then, the number of particles on the wafer was measured, and its result is shown in FIG. 4 as elimination rate.

Figure 4:
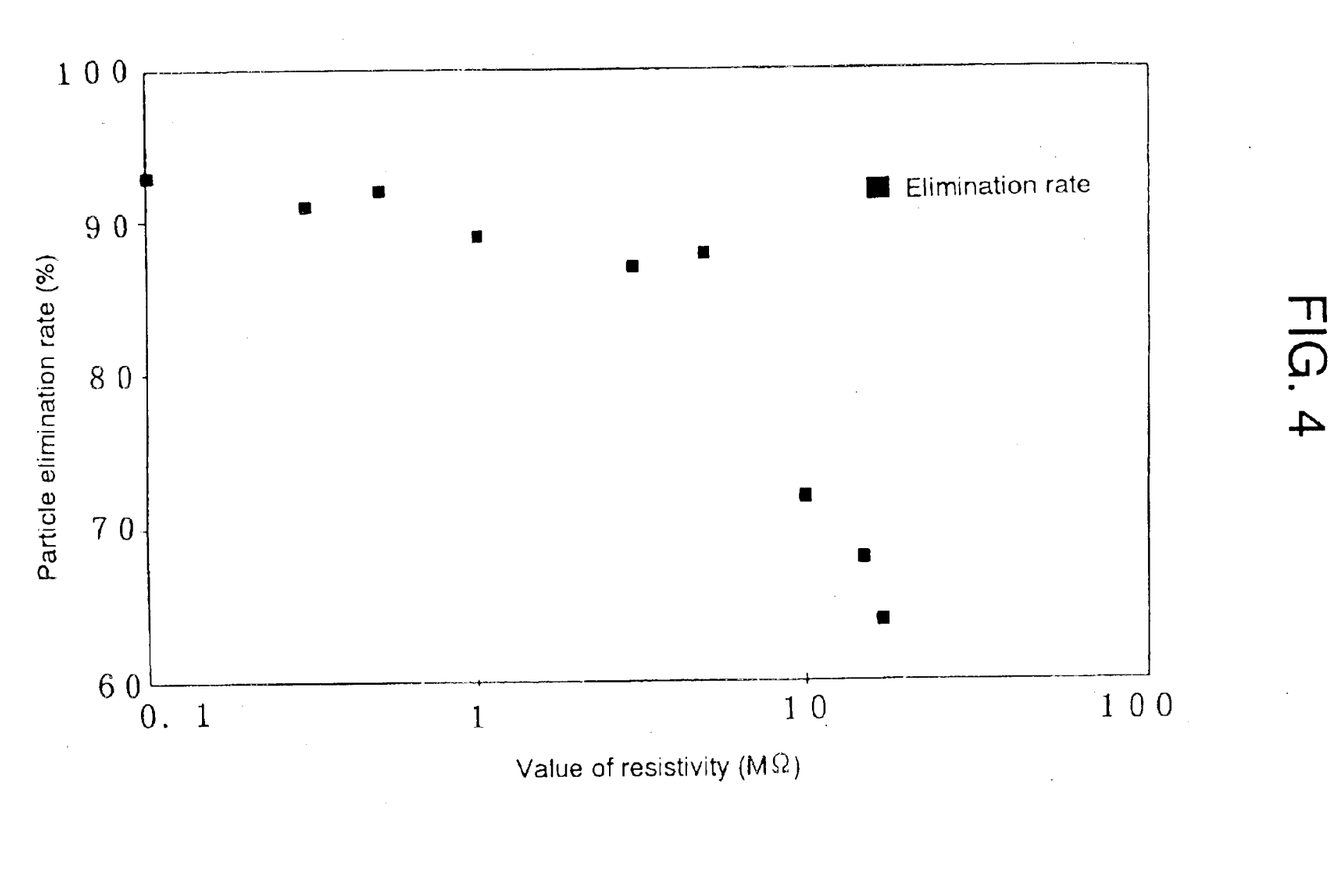
FIG. 4 is a graph showing the relation between resistivity value of cleaning water and the cleaning degree of an object to be cleaned by the cleaning method of the electronic component of the present invention.

As shown in FIG. 4, it was confirmed that the elimination rate of the particles is extremely increased as the resistivity of the cleaning water becomes equal to 10M or less, especially equal to 5 m$\Omega$ or less.

What is claimed is:

1. A method of cleaning an electronic component comprising bringing a sponge member into contact with an object to be cleaned while supplying, to said object to be cleaned, a solution consisting essentially of water and carbon dioxide having a resistivity value of less than 5 M$\Omega$, wherein said sponge member is separated from said object to be cleaned during cleaning, and said solution is supplied also to the separated sponge member, wherein contaminants are removed from the sponge member.

2. A method of cleaning an electronic component according to claim 1, wherein said object to be cleaned is a ceramic wafer.

3. A method of cleaning an electronic component according to claim 1 or 2, wherein said object to be cleaned is soaked in water having a resistivity value of 10M$\Omega$ or less before cleaning.

4. The method according to claim 1, wherein said object to be cleaned is made of aluminum titanium carbide.

5. The method according to claim 1, wherein said solution has a resistivity value of 0.5 M$\Omega$ or less.

6. The method according to claim 1, wherein said solution has a resistivity value of 0.3 M$\Omega$ or less.

* * * * *